(12) United States Patent
Martin et al.

(10) Patent No.: US 7,504,712 B2
(45) Date of Patent: Mar. 17, 2009

(54) ELECTRONIC DEVICE WITH SELECTIVE NICKEL PALLADIUM GOLD PLATED LEADFRAME AND METHOD OF MAKING THE SAME

(75) Inventors: Joseph Andrew Martin, Hksar (CN); King Yin Fred Fu, Hksar (CN); Hoi Ping Patrick Phen, Hksar (CN)

(73) Assignee: QPL Limited, HKSAR (CN)

( * ) Notice: Subject to any disclaimer, the term of this patent is extended or adjusted under 35 U.S.C. 154(b) by 292 days.

(21) Appl. No.: 11/399,542

(22) Filed: Apr. 7, 2006

(65) Prior Publication Data

US 2007/0235843 A1 Oct. 11, 2007

(51) Int. Cl.
*H01L 23/495* (2006.01)

(52) U.S. Cl. .................. 257/666; 257/762; 257/764; 438/123; 438/124

(58) Field of Classification Search .................. 257/666, 257/762, 764, 767; 438/123, 124, 126, 127
See application file for complete search history.

(56) References Cited

U.S. PATENT DOCUMENTS

| 6,667,073 | B1 | 12/2003 | Lau et al. |
| 6,822,319 | B1 | 11/2004 | Lau et al. |
| 6,828,660 | B2 * | 12/2004 | Abbott .................. 257/666 |
| 7,078,809 | B2 | 7/2006 | Yap et al. |
| 2006/0097366 | A1 | 5/2006 | Sirinorakul et al. |

FOREIGN PATENT DOCUMENTS

JP  62069541 A  *  3/1987

OTHER PUBLICATIONS

Dr. Juürgen Barthelmes, Yoon Foong Yap, Reliable Adhesion-Enhanced Leadframes plated with Ultrathin Ni/Pd/Au.
Dr. J. Barthelmes, C. Wunderlich, M. Danker, D.-G. Neoh, Successfully Linking Leadframe Roughening Processes for Adhesion Improvement to the Ultra Thin Ni/Pd/Au Technology.
HDP User Group International, Inc., Nickel-Palladium based Component Terminal Finishes, Document PPF Project, Apr. 12, 2005, Rev 05.
Akira Chinda, Hisanori Akino, Ryoichi Koizumi, Environmental Protecting Palladium-Plated Leadframe, Hitachi Cable Review, Aug. 1998, No. 17-9.
John Quist, Pb-Free Product Transition White Paper, Apr. 7, 2004.

* cited by examiner

*Primary Examiner*—Phuc T Dang
(74) *Attorney, Agent, or Firm*—Eagle IP Limited; Jacqueline C. Lui

(57) ABSTRACT

An electronic device comprises a leadframe attached to a die and embedded in a mold packaging with enhanced adhesion property. The leadframe comprises a bonding surface, a soldering surface, a mold adhesion surface, and a die attachment surface wherein the soldering surface and bonding surface are selectively plated with nickel/palladium/gold. The mold adhesion surface and the die attachment surface are roughened for better attachment to a mold and a die respectively.

12 Claims, 3 Drawing Sheets

ELECTRONIC DEVICE WITH SELECTIVE NICKEL PALLADIUM GOLD PLATED LEADFRAME AND METHOD OF MAKING THE SAME

FIELD OF INVENTION

This invention relates to electronic devices with enhanced adhesion property, and in particular die packages and leadframes used therefor. This invention also relates to methods of making such electronic devices and leadframes.

BACKGROUND OF INVENTION

With the increasingly stringent requirement worldwide for environmentally friendly products, electronic devices that include heavy metals such as lead are likely to be slowly phased out. Therefore, electronic devices using bare copper as the soldering surfaces are slowly being replaced by those plated with other materials on such surfaces. Full plating of nickel/palladium/gold (Ni/Pd/Au) on all surfaces of the leadframe can avoid employing lead on the soldering surfaces; however, such surfaces have reduced adhesion to the molding compound.

It is therefore an object of the present invention to provide an improved leadframe.

SUMMARY OF INVENTION

Accordingly, the present invention provides in one aspect an electronic device comprising a leadframe attached to a die and embedded in a mold packaging. The leadframe is wire bonded to the die and contains at least one predetermined bonding surface with the wires bonded thereon; at least one predetermined soldering surface exposed to the exterior of the mold packaging and adapted for soldering connection with an external circuit; at least one predetermined mold adhesion surface with mold attached on; and at least one predetermined die attachment surface whereon the die is attached thereto. The soldering surface is plated with nickel/palladium/gold; the bonding surface is plated with a metal; and the mold adhesion surface and the die attachment surface are roughened to increase the surface area for attachment to the mold and the die respectively.

In the preferred embodiment, the soldering surface and the bonding surface are non-roughened; the bonding surface is also plated with nickel/palladium/gold. In a more preferred embodiment, the leadframe further comprises at least one predetermined exposed surface provided outside the mold packaging for connecting the leadframe to an external circuit. The exposed surface is preferably plated with nickel/palladium/gold. In yet another preferred embodiment, the side edges of the leadframe are also roughened to increase the surface area for attachment to the mold for enhanced adhesion.

According to another aspect of the present invention, there is provided a leadframe for electrical connection in a die packaging. This improved leadframe contains at least one predetermined bonding surface for wire bonding thereon; at least one predetermined soldering surface adapted for exposure to the exterior of the packaging for solder connection with an external circuit; at least one predetermined mold adhesion surface for adhesion of packaging mold thereto; and at least one predetermined die attachment surface for attachment of the die thereto. The soldering surface is plated with nickel/palladium/gold while the bonding surface is plated with a metal. The mold adhesion surface and the die attachment surface are roughened to increase the surface area for attachment to the mold and the die respectively such that adhesion is enhanced.

In the preferred embodiment, the soldering surface and the bonding surface are non-roughened; the bonding surface of the leadframe is also plated with nickel/palladium/gold. In a more preferred embodiment, the leadframe further contains at least one predetermined exposed surface provided outside the mold packaging for connecting the leadframe to an external circuit. The exposed surface is preferably also plated with nickel/palladium/gold. In another preferred embodiment, the side edges of the leadframe are also roughened to increase the surface area for attachment to the mold such that adhesion is enhanced.

In another aspect of the present invention, a method is provided for treating the leadframe as described above by first selectively protecting the molding and die attachment surfaces from plating, followed by selectively plating the wire bonding surface of the leadframe with nickel/palladium/gold. Afterwards, the contact surfaces of the leadframe with the die and the mold packaging are selectively roughened. In the preferred implementation, the soldering surface is also plated with nickel/palladium/gold. In another preferred implementation, the selective plating step(s) comprises the steps of coating the leadframe with a protective material; selectively removing the protective material from preselected surfaces of the leadframe on which the nickel/palladium/gold plating is desired; and plating the nickel/palladium/gold layer onto the preselected surface.

In yet a further aspect of the present invention, an electronic device is provided containing a leadframe attached to a die and embedded in a mold packaging. The leadframe is wire-bonded to the die for electrical interconnection therebetween, and has sufficiently enhanced adhesiveness to the mold packaging to remain laminated for at least one year at a minimum temperature of 30° C. and a minimum relative humidity of 60%.

Using the above method, the attachment of the mold resin in the package to the leadframe is enhanced, and yet still maintains the safety requirements of not having heavy metal in the soldering material. Furthermore, the selective roughening would allow the bonding and/or soldering surfaces to remain smooth, thereby maintaining the good bondability and solderability of these two surfaces respectively. In addition, because the bonding and/or soldering surfaces are protected from roughening, the user has the option of treating the remaining surfaces that are used for die and mold resin attachment more extensively with the roughening process, thereby increasing the roughness of these surfaces and increasing the attachment ability even beyond what can be achieved conventionally by the same roughening process. Since the mold adhesion of the leadframe is enhanced by the selectively roughened surfaces, any metal with good wire bondability can be used as the plating material onto the bonding surface regardless of its adhesion property. This further allows for development of wire bonding material without the requirement for adhesion properties.

DETAILED DESCRIPTION OF THE PREFERRED EMBODIMENTS

As used herein and in the claims, an "electronic device" refers to an apparatus that carries out its functions electronically and contains the package or leadframe according to the present invention. The term "comprising" should be construed to mean "including but not limited to". A "leadframe" refers to a metal frame that connects a packaged chip to an external circuit and provides a supporting platform with direct and/or indirect electrical interconnections for a die. "Selective plating" refers to a plating process wherein some predetermined surfaces on the leadframe are chosen to be plated.

Figure 1:
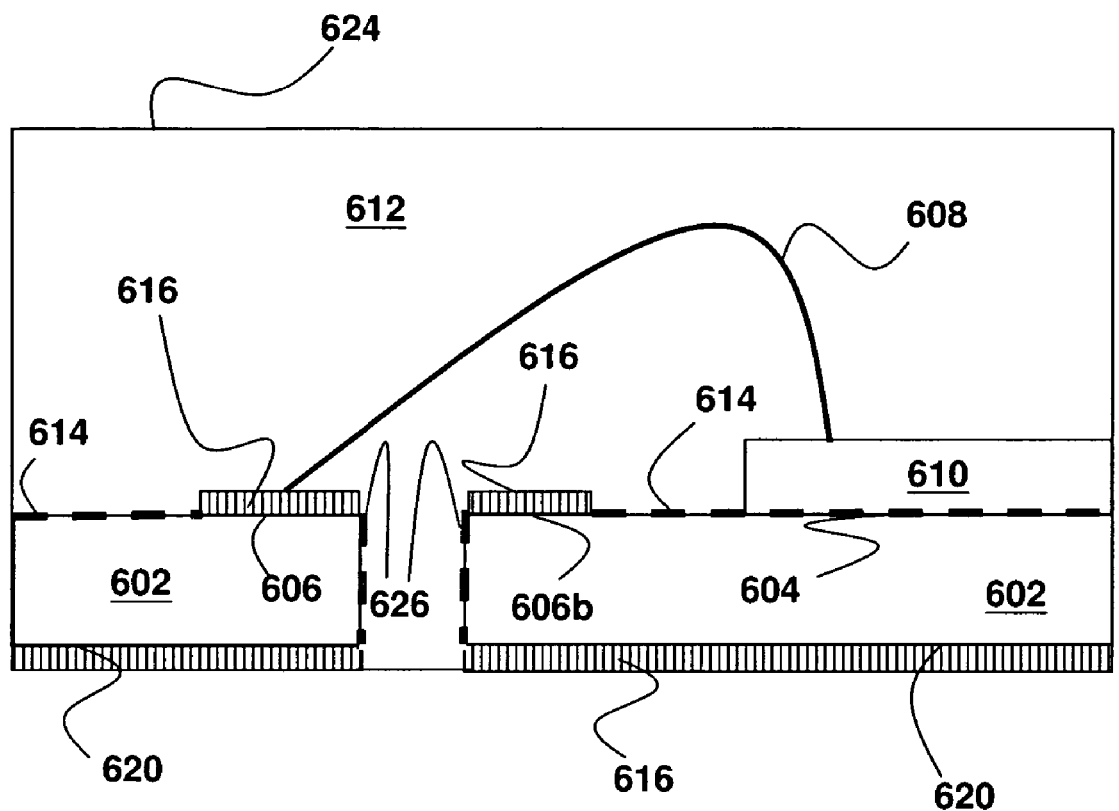
FIG. 1 shows a cross-sectional view of a mold package with exposed leadframe according to one embodiment of the present invention.

Referring now to FIG. 1, the first embodiment of the present invention is an electronic device containing a leadframe 602 whereon a die 610 is attached to and wire bonded. The leadframe 602 further contains a bonding surface 606 for wire bonding of wire 608 with the die 610; a die attachment surface 604 on which the die 610 attaches; soldering surfaces 620 exposed to the exterior of mold packaging 624; and mold adhesion surfaces 614 for attaching mold 612. In this example, the leadframe 602 is selectively plated with nickel/palladium/gold (Ni/Pd/Au) 616 (shown in boxes with vertical lines) on the soldering surfaces 620 and the bonding surfaces 606 and 606b (without wire bonded). In addition, these soldering and bonding surfaces are not treated with any roughening process (i.e. smooth or non-roughened). The remaining surfaces (the die attachment surface 604 and mold adhesion surfaces 614) are protected and free of metal plating by masking but are roughened (roughened surfaces are shown in broken lines) to increase the surface area for enhancing respective attachment to die 610 and mold 612. The side edges of the leadframe 626 are also roughened for enhanced adhesion to mold 612. In this embodiment, a portion of the leadframe (soldering surface 620) is exposed to the exterior of the mold packaging 624 such that it can directly connect to an external circuit.

Figure 2:
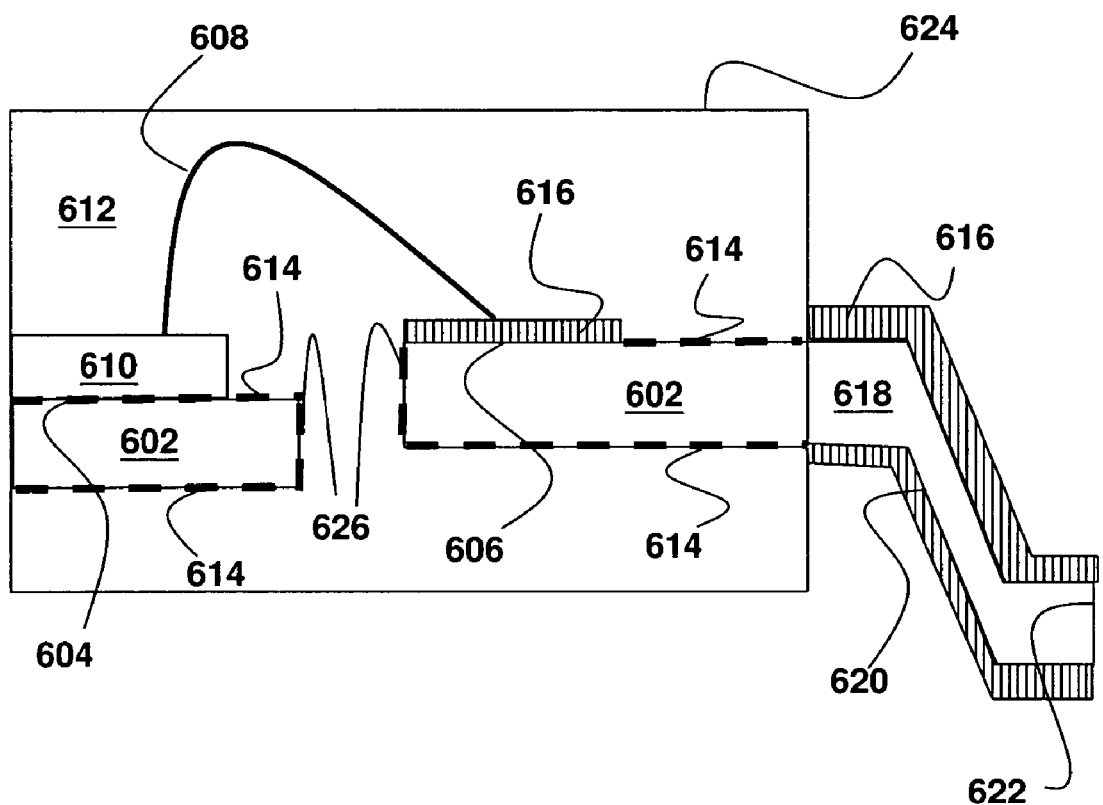
FIG. 2 illustrates a cross-sectional view of a mold package with a lead finger according to another embodiment of the present invention.

In another embodiment of this invention as shown in FIG. 2, an electronic device contains a leadframe 602 and a lead finger 618. A die 610 is attached and bonded with a wire 608 to the leadframe 602. This leadframe 602 further contains a bonding surface 606 with wires 608 bonded thereto; a die attachment surface 604 for the attachment of the die 610; mold adhesion surfaces 614 on which mold 612 attaches; and a soldering surface 620 exposed to exterior of the mold package 624. In this example, the soldering surface 620 covers the lead finger 618 except for a vertical surface 622. The soldering surface 620 and the bonding surface 606 are not treated with any roughening process (i.e. smooth or non-roughened) and selectively plated with Ni/Pd/Au 616 (shown in boxes with vertical lines). The remaining surfaces, (die attachment surface 604 and mold adhesion surfaces 614) are protected from metal plating by masking but are roughened (roughened surfaces are shown in broken lines) to increase surface area for attaching to die 610 and mold 612 respectively, resulting in an enhanced adhesion. The side edges of the leadframe 626 are also roughened for enhanced adhesion to mold 612. In this example, there exists a portion of the leadframe 602 extending out of the mold packaging 624 to form the lead finger 618. Accordingly, in this embodiment, the leadframe 602 connects to an external circuit by means of the soldering surface 620 on the lead finger 618.

Figure 3:
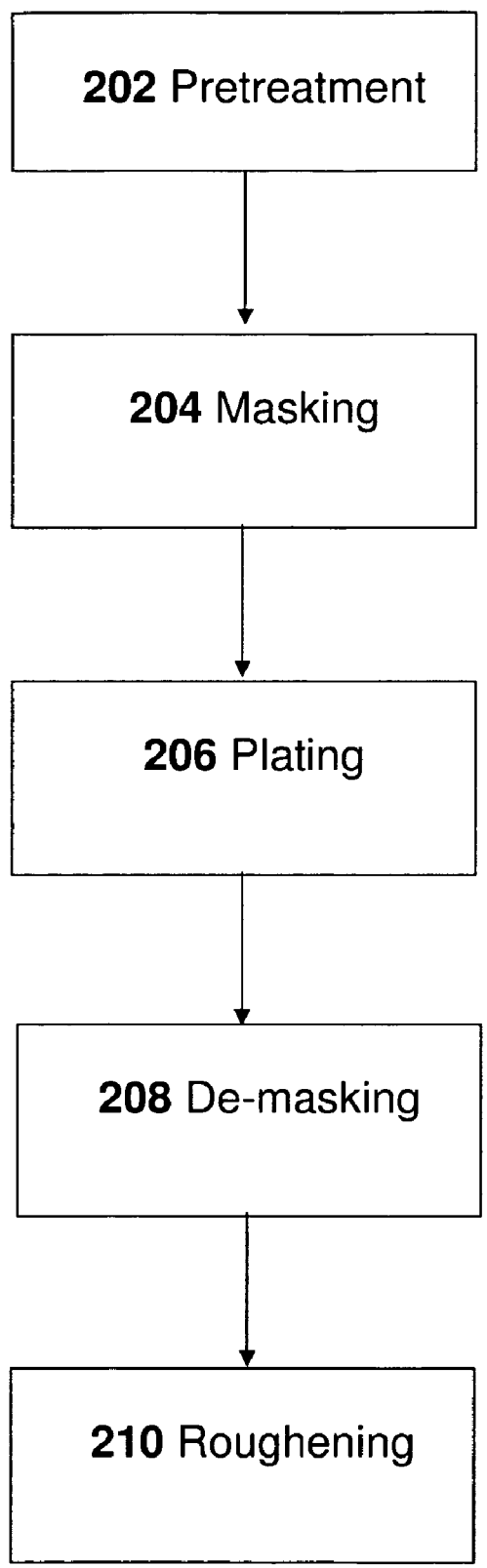
FIG. 3 outlines the process of selective plating and roughening on a leadframe according to one embodiment of the present invention.

Turing now to FIG. 3, steps for selective plating and roughening on a leadframe are provided according to this invention. After the pretreatment step 202, the leadframe undergoes a step of masking 204 to protect some predetermined surfaces from plating. In a more preferred embodiment, the masking is performed by wet film process. The masked surfaces cover the mold adhesion surfaces 614 and the die attachment surfaces 604, and preferably the side edges of the leadframe 626. In the step of plating 206, the masked leadframe is plated with metal such that only the exposed (unmasked) surfaces (soldering surfaces 620 and bonding surfaces 606) are plated. In the preferred embodiment shown in FIGS. 1 and 2, the leadframe is plated with Ni/Pd/Au according to conventional methods. Then, the protective layers on the masked surfaces are removed in the step of de-masking 208, followed by a step of roughening 210 to roughen the previously masked surfaces for enhancing adhesion to mold. The previously unmasked surfaces would not be roughened as they have been plated in the previous plating step and therefore protected from the roughening reagent.

The preferred embodiments of the present invention are thus fully described. Although the description referred to particular embodiments, it will be clear to one skilled in the art that the present invention may be practiced with variation of these specific details. Hence this invention should not be construed as limited to the embodiments set forth herein.

For example, although two bonding surfaces 606 and 606b are shown in FIG. 1, it is clear that different number of bonding surfaces can be implemented onto the leadframe depending on leadframe designs and applications. Further, the mold packages shown in FIGS. 1 and 2 are only two of the examples of the packaging available on the market, and it is clear that other packages such as quad flat non-lead package (QFN) and quad flat pad (QFP) would also fall within the scope of the present invention. The lead finger may also be of different shapes other than the one shown in FIG. 2.

What is claimed is:

1. An electronic device comprising a leadframe attached to a die and embedded in a mold packaging, said leadframe with wires bonded to said die for electrical interconnection therebetween, said leadframe further comprises
    a) at least one predetermined bonding surface with said wires bonded thereon;
    b) at least one predetermined soldering surface exposed to the exterior of said mold packaging and adapted for soldering connection with an external circuit;
    c) at least one predetermined mold adhesion surface whereon said mold is attached thereto; and
    d) at least one predetermined die attachment surface whereon said die is attached thereto; wherein said soldering surface and said bonding surface are non-roughened and nickel palladium gold is deposited onto the surface of said leadframe at said soldering surface and said bonding surface; and said mold adhesion surface and said die attachment surface are free of metal plating and roughened to increase the surface area for attachment to said mold and said die respectively such that adhesion is enhanced.

2. The device according to claim 1 wherein a roughening agent is used for roughening said leadframe material; and said roughening agent is non-reactive with said nickel palladium gold.

3. The device according to claim 1 wherein said leadframe further comprises at least one predetermined exposed surface provided outside said mold packaging for connecting said leadframe to an external circuit, wherein said exposed surface is plated with nickel palladium gold.

4. The device according to claim 1 wherein side edges of said leadframe are roughened to increase the surface area for attachment to said mold such that adhesion is enhanced.

5. A leadframe for electrical connection in a die packaging comprising
   a) at least one predetermined bonding surface for wire bonding thereon;
   b) at least one predetermined soldering surface adapted for exposure to the exterior of said packaging for solder connection with an external circuit;
   c) at least one predetermined mold adhesion surface for adhesion of packaging mold thereto; and
   d) at least one predetermined die attachment surface for attachment of said die thereto; wherein said soldering surface and said bonding surface are non-roughened and nickel palladium gold is deposited onto the surface of said leadframe material at said soldering surface and said bonding surface; said mold adhesion surface and said die attachment surface are free of metal plating and roughened to increase the surface area for attachment to said mold and said die respectively such that adhesion is enhanced.

6. The leadframe according to claim 5 wherein a roughening agent is used for roughening said leadframe material; and said roughening agent is non-reactive with said nickel palladium gold.

7. The leadframe according to claim 5 wherein said leadframe further comprises at least one predetermined exposed surface provided outside said mold packaging for connecting said leadframe to an external circuit, wherein said exposed surface is plated with nickel palladium gold.

8. The leadframe according to claim 5 wherein side edges of said leadframe are roughened to increase the surface area for attachment to said mold such that adhesion is enhanced.

9. In an electronic device according to claim 1, a method of treating said leadframe for enhanced attachability to said mold package and said die comprising
   a) selectively protecting the molding and die attachment surfaces from plating;
   b) selectively plating the wire bonding surface of said leadframe with nickel palladium gold; and
   c) selectively roughening said contact surfaces of said leadframe with said die and said mold packaging.

10. The method according to claim 9 further comprising the step of selectively plating said soldering surface with nickel palladium gold.

11. The method according to claim 9 wherein said selective plating step comprises the steps of coating said leadframe with a protective material; selectively removing said protecting material from preselected surfaces of said leadframe on which said nickel palladium gold plating is desired; and plating said nickel palladium gold layer onto said preselected surfaces.

12. An electronic device according to claim 1 characterized in that said leadframe adheres to said mold packaging with sufficient strength to remain laminated for at least one year at a minimum temperature of 30° C. and a minimum relative humidity of 60%.

* * * * *